(12) United States Patent
Ayanoor-Vitikkate et al.

(10) Patent No.: US 10,121,518 B1
(45) Date of Patent: Nov. 6, 2018

(54) REDUCING LEAK RATE IN ADHESIVE-BASED HERMETICALLY-SEALED DATA STORAGE DEVICES AND SYSTEMS

(71) Applicant: Western Digital Technologies, Inc., San Jose, CA (US)

(72) Inventors: Vipin Ayanoor-Vitikkate, Union City, CA (US); Toshiki Hirano, San Jose, CA (US); Neale M. Jones, Morgan Hill, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/629,558

(22) Filed: Jun. 21, 2017

(51) Int. Cl.
G11B 33/14 (2006.01)
G11B 33/02 (2006.01)

(52) U.S. Cl.
CPC ........ *G11B 33/1466* (2013.01); *G11B 33/022* (2013.01); *G11B 33/027* (2013.01)

(58) Field of Classification Search
None
See application file for complete search history.

(56) References Cited

U.S. PATENT DOCUMENTS

| | | | |
|---|---|---|---|
| 4,686,592 A | 8/1987 | Carroll et al. | |
| 5,187,621 A * | 2/1993 | Tacklind | G11B 33/1493 360/97.21 |
| 8,279,552 B2 | 10/2012 | Stipe | |
| 9,001,458 B1 | 4/2015 | Ayanoor-Vitikkate et al. | |
| 9,522,446 B2 | 12/2016 | Law et al. | |
| 9,536,572 B2 | 1/2017 | Lapp et al. | |
| 2003/0179489 A1* | 9/2003 | Bernett et al. | G11B 33/1466 360/97.22 |
| 2004/0121109 A1* | 6/2004 | Anderson | B32B 3/08 428/67 |
| 2011/0212281 A1 | 9/2011 | Jacoby et al. | |
| 2012/0275052 A1* | 11/2012 | McGuire, Jr. et al. | G11B 33/1466 360/97.12 |
| 2012/0275287 A1* | 11/2012 | McGuire, Jr. et al. | G11B 33/1466 29/603.03 |
| 2016/0104515 A1 | 4/2016 | Strange | |

(Continued)

OTHER PUBLICATIONS

NIDEC Corporation, Helium-Filled Hard Disk Drives, downloaded from http://www.nidec.com/en-EU/technology/story/helium_hdd/ on Feb. 17, 2017, 3 pages.

(Continued)

*Primary Examiner* — Craig A. Renner
(74) *Attorney, Agent, or Firm* — John D. Henkhaus

(57) ABSTRACT

A hermetically-sealed container for one or more data storage devices may include a base having grooves, and corresponding sidewalls disposed within each groove, with an adhesive disposed within each groove and bonding each sidewall to the base, and with gap spacing mechanisms positioned within each groove between the corresponding sidewall and the base, thereby ensuring a gap for sufficient flow of the adhesive between each sidewall and the base. The adhesive may be a liquid-based epoxy adhesive, and whereby the spacing mechanisms enable sufficient capillary action to wet all the surfaces to form a sound hermetic bond or seal between the sidewalls and the base. The container may, then, be filled with a lighter-than-air gas such as helium.

24 Claims, 5 Drawing Sheets

(56) References Cited

U.S. PATENT DOCUMENTS

2016/0307606 A1    10/2016   McGuire, Jr. et al.
2017/0053678 A1     2/2017   Albrecht et al.

OTHER PUBLICATIONS

International Search Report and Written Opinion dated Jun. 1, 2018 from related PCT Serial No. PCT/US2018/021415, 11 pages.

\* cited by examiner

REDUCING LEAK RATE IN ADHESIVE-BASED HERMETICALLY-SEALED DATA STORAGE DEVICES AND SYSTEMS

FIELD OF EMBODIMENTS

Embodiments of the invention may relate generally to data storage devices and particularly to approaches for reducing the leak rate in adhesive-based hermetically-sealed hard disk drives and storage systems.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack, and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants.

Electronic systems that require a hermetically sealed internal volume (e.g., a lighter-than-air gas filled, sealed HDD or system of HDDs) need a way of preventing the occurrence of leakage through the interface between the cover and the corresponding enclosure base to which the cover is coupled. One approach is to utilize two covers, one being the typical HDD cover coupled to the base with fasteners (a "first cover") with a gasket seal therebetween, but not hermetically-sealed, with another cover (a "second cover") being laser welded or otherwise bonded to the base over the first cover. Another approach may be to adhesively bond the sidewalls of the cover (e.g., a "tub cover") that overlap with the base sidewalls, by applying a liquid adhesive (e.g., an epoxy) around the perimeter interface between the respective sidewalls. Regardless, challenges remain with reliably and efficiently hermetically sealing data storage devices such as HDDs, and data storage systems containing multiple HDDs.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to hermetically sealing a container for one or more data storage devices (e.g., a hard disk drives or optical disk drives) are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of a digital data storage device (DSD), such as a hard disk drive (HDD), and in the context of a system of multiple DSDs/HDDs. Thus, in accordance with an embodiment, a plan view illustrating an HDD 100 is shown in FIG. 1 to illustrate an exemplary operating context.

Figure 1:
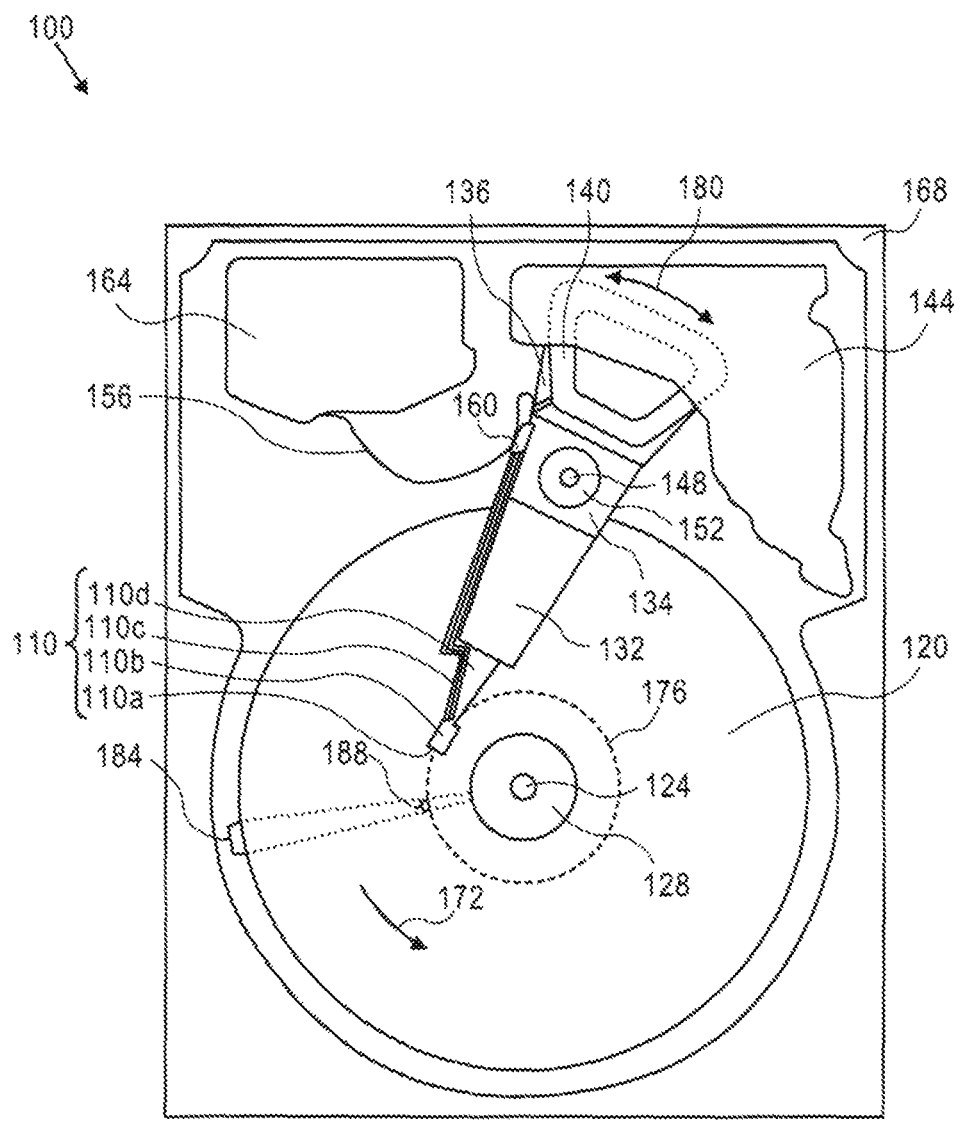
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "hermetically-sealed", "negligible leakage", "no leakage", etc. may be used herein, note that such a system would often still have a certain amount of permeability and, therefore, not be absolutely leak-free. Hence, the concept of a desired or target "leak rate" may be used herein.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Recall that electronic systems that require a hermetically sealed internal volume (e.g., a lighter-than-air gas filled, sealed HDD or system of HDDs) need a way of preventing the occurrence of leakage through the cover-to-base interface, with one approach relying on an epoxy-based adhesive perimeter seal. A cost effective approach to sealing HDDs using a secondary container is described in U.S. Pat. No. 9,001,458, and such an approach is not restricted to single HDDs but can be used to seal a storage system enclosure containing multiple HDDs.

Figure 2:
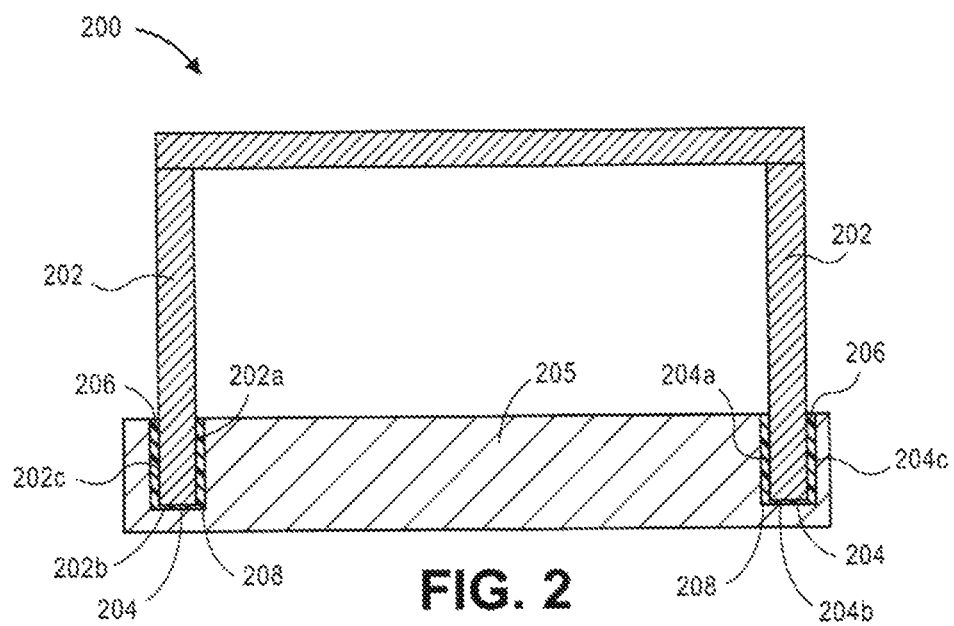
FIG. 2 is a cross-sectional front view illustrating an adhesive-based sidewall-in-groove sealing technique, according to an embodiment.

FIG. 2 is a cross-sectional front view illustrating an adhesive-based sidewall-in-groove sealing technique, according to an embodiment. With a container such as container 200, a box-type container comprises sidewalls 202 that slide into an open groove 204 (or slot, channel) of an enclosure base 205 (also "baseplate" or "plate") that is at least partially filled with a low-permeability adhesive 206 such as epoxy. Such a setup is relatively simple to manufacture and reduces the machining cost of the enclosure. However, while using epoxy to seal metal surfaces and store gases like helium (or other lighter-than-air gases), challenges to overcome include providing a sufficiently low leak rate through the seal 208 and avoiding thermal mismatch stresses between the sidewalls 202 and groove 204 due to unequal thicknesses of epoxy on the two sides of each sidewall 202.

One way to ensure uniform spread of the liquid adhesive within the groove is to utilize capillary action (also referred to as capillary motion and wicking), which is the ability of a liquid to flow in narrow spaces without the assistance of (or perhaps in opposition to) external forces such as gravity. Capillary action is, generally, based on intermolecular forces between the liquid and surrounding solid surfaces. If the gap between surfaces that are to be sealed is kept small (e.g., 20-200 um), then the capillary action of the adhesive may be relied upon to obtain a thin adhesive thickness and to therefore minimize the leak rate. Furthermore, the capillary action may also be enhanced and the adhesive joint strength increased by surface treatments such as bead blasting, knurling or roughening of the surfaces.

Thermal mismatch stresses may arise due to non-uniformity of adhesive 206 thickness or a complete lack of adhesive 206 on one side of the sidewall 202. This issue is particularly challenging in the sidewall-in-groove type of sealing arrangement illustrated in FIG. 2, as the ability to center the sidewall 202 in the groove 204 is often lacking. Even if one were to successfully position the sidewall 202 during the adhesive reflow process, the sidewall 202 may shift closer to one side during curing. If the sidewall 202 is closer to one side of the groove 204, sufficient flow of adhesive 206 may be inhibited. This can result in a reduced gas diffusion length through the adhesive seal 208, and may increase the diffusion area, thereby increasing the leak rate. For example, if the diffusion length was to halve and the diffusion area (e.g., thickness) was to double, due to sidewall misalignment, the corresponding leak rate may undesirably increase by a factor of four.

While it may be possible that the adhesive 206 is able to spread to the inner side of the groove 204, the thickness of the adhesive may be unequal on the two sides of the sidewall 202, which can cause excessive stress during thermal cycling or at very low temperatures as the adhesive 206 is cured at elevated temperatures and residual stress develops when the adhesive 206 cools down to room temperature. This can be mitigated if the thermal coefficient of expansion of the adhesive 206 is the same as that of the metal (e.g., the base), however usually the adhesive 206 (e.g., an epoxy) has a much higher thermal coefficient of expansion value compared to solid metals.

Ensuring Sufficient Capillary Action with Spacer Mechanisms

The foregoing challenges can be can be solved by ensuring that each sidewall 202 stays centered in the corresponding groove 204 to ensure sufficient or substantial flow of the adhesive 206 between each sidewall 202 and the base 205 so that there is nearly equal thickness of adhesive 206 on both sides of each sidewall 202, according to an embodiment.

Figure 3:
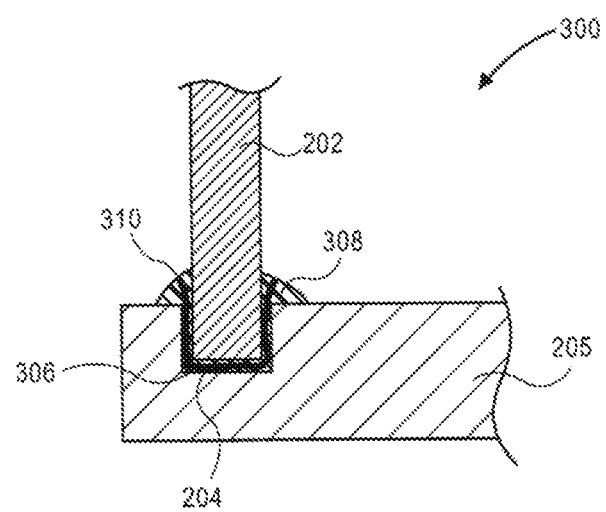
FIG. 3 is a cross-sectional front view illustrating an adhesive-based sidewall-in-groove sealing technique, according to an embodiment.

FIG. 3 is a cross-sectional front view illustrating an adhesive-based sidewall-in-groove sealing technique, according to a first embodiment. As with the embodiment of FIG. 2, a hermetically-sealed container 300 (also "container 300") comprises the base 205 having a groove 204 (also, channel or slot) therein, with a container sidewall 202 disposed or positioned within the groove 204. According to an embodiment, the container 300 comprises one or ore spacing mechanisms 310 (also, spacers, gap spacers, centering spacers) positioned or disposed within a corresponding groove 204 between a corresponding sidewall 202 and the base 205. As alluded to above, the spacing mechanism 310 facilitates or ensures that the sidewall 202 stays centered in the groove 204 to thereby ensure that sufficient flow (such as by capillary action) of the adhesive 306 occurs between the sidewall 202 and the base 205, so that there is nearly or substantially equal thickness of adhesive 306 on both sides of the sidewall 202. As used herein, "centering" a sidewall such as sidewall 202 within a groove such as groove 204 may be considered to include up to about a 60-40 configuration. That is, the gap between one surface of the sidewall 202 and a corresponding surface of the groove 204 may be up to 1.5 times the gap between the opposing surface of the sidewall 202 and a corresponding surface of the groove 204.

According to an embodiment, the adhesive 306 comprises an epoxy or epoxy-based adhesive, which is in liquid form prior to curing. Hence, the adhesive 306 can be dispensed into the groove 204 prior to, or after, positioning the sidewall 202 into the groove 204. Regardless of the order in which such actions occur, capillary action is promoted or enabled with use of one or more spacing mechanisms 310. Referring back to FIG. 2, each sidewall 202 comprises an inner surface 202a, a bottom surface 202b, and an outer surface 202c. Likewise, each groove 204 comprises an inner surface 204a, a bottom surface 204b, and an outer surface 204c. Hence, with container 300, each spacing mechanism 310 is positioned within a corresponding groove to ensure sufficient capillary action of the adhesive 306 to create a hermetic seal or bond 308 between each inner surface 202a, bottom surface 202b, and outer surface 202c of each sidewall 202 with each corresponding inner surface 204a, bottom surface 204b, and outer surface 204c of each corresponding groove 204.

According to an embodiment, the spacing mechanism 310 comprises a plurality of spacing mechanisms positioned intermittently along each corresponding groove 204. According to one embodiment, one or more spacing mechanisms 310 comprise a thin wire, and, according to another embodiment, one or more spacing mechanisms 310 comprise a metal foil strip or ribbon, positioned intermittently along each corresponding groove 204. If thin wires are employed as spacing mechanisms 310, then each thin wire should have a diameter that is nearly equal to (or slightly less than) the minimum gap, between each surface (e.g., inner, bottom, and outer surfaces 204a, 204b, 204c) of the groove 204 of the base 205 and each corresponding surface (e.g., inner, bottom, and outer surfaces 202a, 202b, 202c) of each corresponding sidewall 202, that is desired to be filled with adhesive 306 in order to form a suitable hermetic seal 308, e.g., such as based on a target or permissible leak rate. Similarly, if metal foil strips are employed as spacing mechanisms 310, then each strip should have a thickness that is nearly equal to the minimum gap between the base 205 and sidewall 202 that is desired to be filled with adhesive 306 in order to form a suitable hermetic seal 308, e.g., again, such as based on a target or permissible leak rate. That is, generally, the spacing mechanisms 310 ensure enough gap so that the adhesive 306 can flow from one side or surface to the other side or surface. It is contemplated that a combination of thin wires and foil strips may be implemented in conjunction with each other to function as spacing mechanisms 310. Furthermore, the manner in which the spacing mechanisms 310 are installed within each groove 204 may vary from implementation to implementation.

In the context of the aforementioned excessive stress during thermal cycling or at very low temperatures, according to an embodiment, the thermal coefficient of expansion of the spacing mechanism 310 is the same or nearly the same as that of the base 205. According to an embodiment, the spacing mechanism 310 is composed of the same metal or material as that of the base 205.

Use of Protrusion Spacers

Another approach to ensuring similar adhesive flow results as discussed herein with respect to spacing mechanisms 310 (FIG. 3) is by employing tabs or protrusions on the sidewalls.

Figures 4A, 4B:
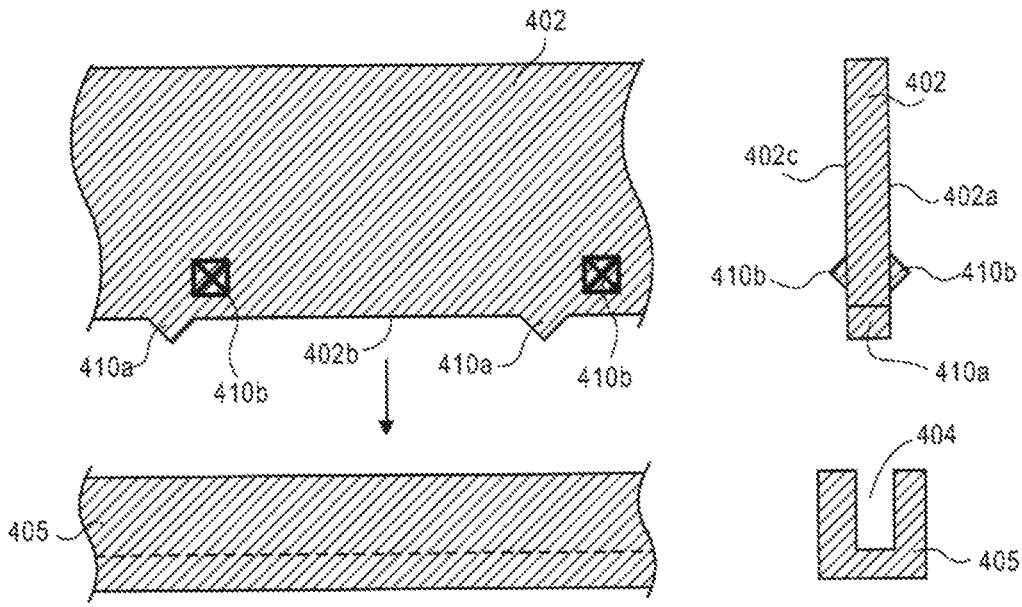
FIG. 4A is a cross-sectional side view illustrating an adhesive-based sidewall-in-groove sealing technique, according to an embodiment.
FIG. 4B is a cross-sectional front view illustrating the adhesive-based sidewall-in-groove sealing technique of FIG. 4A, according to an embodiment.

FIG. 4A is a cross-sectional side view illustrating an adhesive-based sidewall-in-groove sealing technique, and FIG. 4B is a cross-sectional front view illustrating the adhesive-based sidewall-in-groove sealing technique of FIG. 4A, according to an embodiment. FIGS. 4A, 4B depict a container sidewall 402 configured for insertion or disposition within a groove 404 of a container base 405, similarly to container 200 of FIG. 2. According to an embodiment, the sidewall 402 comprises one or more spacing mechanisms 410a (or "protrusions 410a") protruding downward from the bottom surface 402b of the sidewall 402, and one or more spacing mechanisms 410b (or "protrusions 410b") protruding outward from each of the inner surface 402a and the outer surface 402c of the sidewall 402. While the shape of protrusions 410a, 410b are depicted as pyramidal in FIGS. 4A, 4B, the shape of protrusions 410a, 410b may vary from implementation to implementation, as long as such protrusions are suitable for the intended purpose of, generally, substantially centering the sidewall 402 within the groove 404 to thereby ensure that sufficient flow (such as by capillary action) of a liquid adhesive (e.g., adhesive 306 of FIG. 3) occurs between the sidewall 402 and the base 405 so that there is nearly or substantially equal thickness of adhesive on both sides of the sidewall 402.

Figures 5A, 5B:
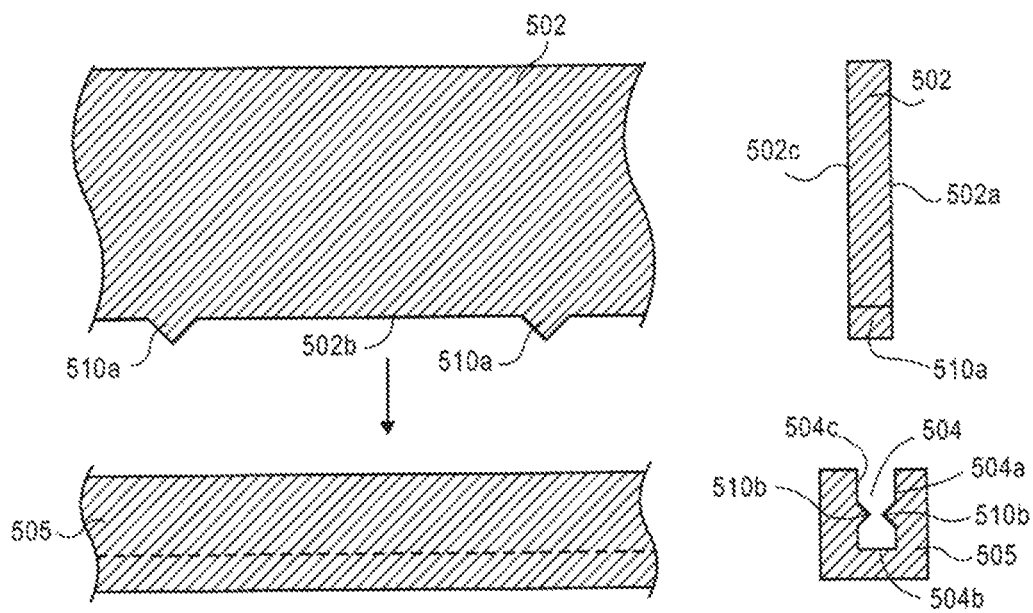
FIG. 5A is a cross-sectional side view illustrating an adhesive-based sidewall-in-groove sealing technique, according to an embodiment.
FIG. 5B is a cross-sectional front view illustrating the adhesive-based sidewall-in-groove sealing technique of FIG. 5A, according to an embodiment.

FIG. 5A is a cross-sectional side view illustrating an adhesive-based sidewall-in-groove sealing technique, and FIG. 5B is a cross-sectional front view illustrating the adhesive-based sidewall-in-groove sealing technique of FIG. 5A, according to an embodiment. FIGS. 5A, 5B depict a container sidewall 502 configured for insertion or disposition within a groove 504 of a container base 505, similarly to container 200 of FIG. 2. According to an embodiment, the sidewall 502 comprises one or more spacing mechanisms 510a (or "protrusions 510a") protruding downward from the bottom surface 502b of the sidewall 502. These protrusions 510a can facilitate a vertical gap between the bottom surface 502b of the sidewall 502 and the bottom surface 504b of the groove 504. Functioning in conjunction with protrusions 510a, the groove 504 comprises one or more spacing mechanisms 510b (or "protrusions 510b") protruding inward from each of the inner surface 504a and the outer surface 504c of the groove 504. These protrusions 510b can facilitate adequate horizontal gaps between the inner surface 502a of the sidewall 502 and the inner surface 504a of the groove 504 and between the outer surface 502c of the sidewall 502 and the outer surface 504c of the groove 504. As with the shape of protrusions 410a, 410b of FIGS. 4A, 4B, the shape of protrusions 510a, 510b may vary from implementation to implementation, as long as such protrusions are suitable for the same intended purpose.

Figure 6A:
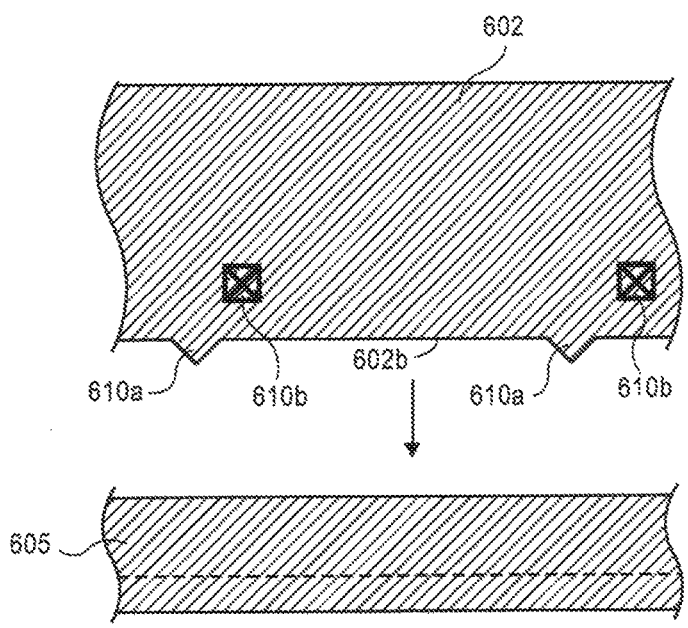
FIG. 6A is a cross-sectional side view illustrating an adhesive-based sidewall-in-groove sealing technique, according to an embodiment.
Figure 6B:
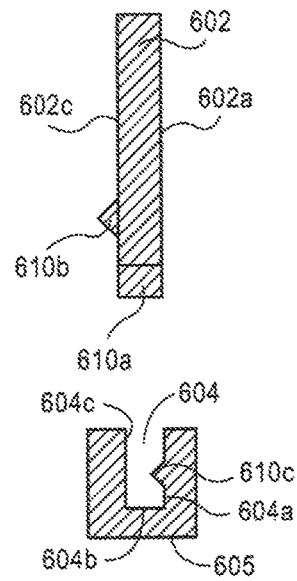
FIG. 6B is a cross-sectional front view illustrating the adhesive-based sidewall-in-groove sealing technique of FIG. 6A, according to an embodiment.

FIG. 6A is a cross-sectional side view illustrating an adhesive-based sidewall-in-groove sealing technique, and FIG. 6B is a cross-sectional front view illustrating the adhesive-based sidewall-in-groove sealing technique of FIG. 6A, according to an embodiment. FIGS. 6A, 6B depict a container sidewall 602 configured for insertion or disposition within a groove 604 of a container base 605, similarly to container 200 of FIG. 2. According to an embodiment, the sidewall 602 comprises one or more spacing mechanisms 610a (or "protrusions 610a") protruding downward from the bottom surface 602b of the sidewall 602, and one or more spacing mechanisms 610b (or "protrusions 610b") protruding outward from the outer surface 602c of the sidewall 602. The protrusions 610a can facilitate a vertical gap between the bottom surface 602b of the sidewall 602 and the bottom surface 604b of the groove 604. Functioning in conjunction with protrusions 610a, 610b, groove 604 comprises one or more spacing mechanisms 610c (or "protrusions 610c") protruding outward from the inner surface 604a of the groove 604. Along with protrusions 610b of the sidewall 602, these protrusions 610c of the groove 604 can facilitate adequate horizontal gaps between the inner surface 602a of the sidewall 602 and the inner surface 604a of the groove 604 and between the outer surface 602c of the sidewall 602 and the outer surface 604c of the groove 604. As with the shape of protrusions 410a, 410b of FIGS. 4A, 4B, the shape of protrusions 610a, 610b, 610c may vary from implementation to implementation, as long as such protrusions are suitable for the same intended purpose.

Figure 6C:
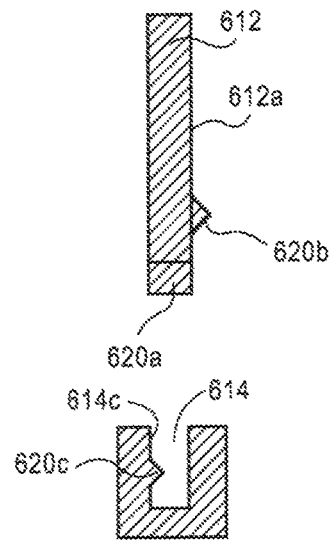
FIG. 6C is a cross-sectional front view illustrating an alternative adhesive-based sidewall-in-groove sealing technique, according to an embodiment.

FIG. 6C is a cross-sectional front view illustrating an alternative adhesive-based sidewall-in-groove sealing technique, according to an embodiment. As an alternative configuration to that depicted in FIGS. 6A, 6B, the sidewall 612 may comprise one or more spacing mechanisms 620a (or "protrusions 620a") protruding downward from the bottom surface of the sidewall 612, and one or more spacing mechanisms 620b (or "protrusions 620b") protruding outward inward from the inner surface 612a of the sidewall 612 and the groove 614 may comprise one or more spacing mechanisms 620c (or "protrusions 620c") protruding inward from the outer surface 614c of the groove 614.

The sidewall-in-plate embodiments and configurations illustrated and described herein may be implemented with or for any electronic and/or data storage systems that require a hermetically-sealed internal volume (e.g., a lighter-than-air gas filled, sealed HDD or a sealed storage system of multiple HDDs), and which employ a liquid adhesive (e.g., epoxy-based) perimeter seal.

A Method of Hermetically Sealing a Container

Figure 7:
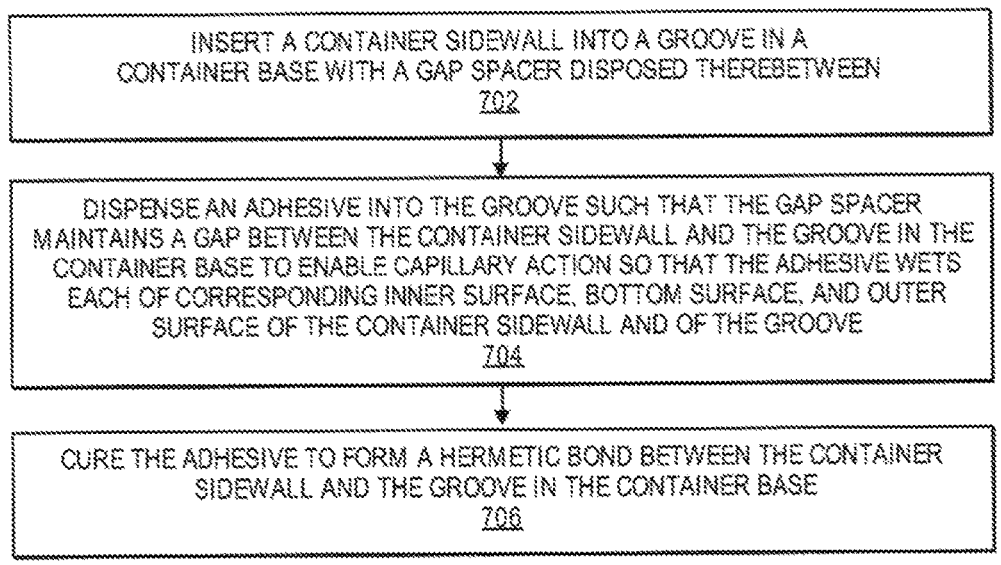
FIG. 7 is a flow diagram illustrating a method of hermetically sealing a container, according to an embodiment.

FIG. 7 is a flow diagram illustrating a method of hermetically sealing a container, according to an embodiment. The method of FIG. 7 is described with reference to, and may be implemented according to the teachings corresponding to, FIGS. 2-6B.

At block 702, a container sidewall is inserted into a groove in a container base, with a gap spacer disposed therebetween. For example, container sidewall 202, 402, 502, 602 is inserted into groove 204, 404, 504, 604, with spacing mechanism(s) 310, 410a-410c, 510a-510c, 610a-610c disposed between the container sidewall and the groove.

At block 704, an adhesive is dispensed into the groove such that the gap spacer maintains a gap between the container sidewall and the groove in the container base, to enable capillary action so that the adhesive wets each of corresponding inner, bottom, and outer surfaces of the container sidewall and the groove. For example, adhesive 310 (e.g., an epoxy-based liquid adhesive) is dispensed into groove 204, 404, 504, 604 such that the spacing mechanism(s) 310, 410a-410c, 510a-510c, 610a-610c maintains a gap between the container sidewall 202, 402, 502, 602 and the groove 204, 404, 504, 604 in the container base 205, 405, 505, 605, to enable capillary action so that the adhesive 310 wets each of corresponding inner surface 202a, 402a, 502a, 602a, bottom surface 202b, 402b, 502b, 602b, and outer surface 202c, 402c, 502c, 602c of the container sidewall and the groove. Note that the order in which blocks 702, 704 are performed may vary from implementation to implementation, the adhesive may be dispensed into the groove before or after inserting the sidewall into the groove.

At block 706, the adhesive is cured to form a hermetic bond between the container sidewall and the groove in the container base. For example, adhesive 310 is cured to form a hermetic bond 308 between the container sidewall 202, 402, 502, 602 and the groove 204, 404, 504, 604 in the container base 205, 405, 505, 605.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hermetically-sealed container for one or more data storage devices, the container comprising:
    an enclosure base having a plurality of grooves, each groove having an inner surface, a bottom surface, and an outer surface;
    a plurality of sidewalls each having an inner surface, a bottom surface, and an outer surface and disposed within a corresponding groove of said plurality of grooves;
    an adhesive disposed within each said groove and bonding a corresponding sidewall with said enclosure base; and
    a plurality of spacing mechanisms each positioned within a corresponding said groove between a corresponding sidewall and said enclosure base to ensure substantial flow of said adhesive between each said sidewall and said enclosure base.

2. The hermetically-sealed container of claim 1, wherein said adhesive is an epoxy-based liquid adhesive prior to curing.

3. The hermetically-sealed container of claim 2, wherein each of said plurality of spacing mechanisms is positioned within said corresponding groove to ensure substantial capillary action of said adhesive to bond each said inner surface, bottom surface, and outer surface of said sidewall with each corresponding said inner surface, bottom surface, and outer surface of said groove of said enclosure base.

4. The hermetically-sealed container of claim 1, wherein at least some of said plurality of spacing mechanisms comprise thin wires positioned intermittently along said corresponding groove.

5. The hermetically-sealed container of claim 1, wherein at least some of said plurality of spacing mechanisms comprise metal foil strips positioned intermittently along said corresponding groove.

6. The hermetically-sealed container of claim 1, wherein said plurality of spacing mechanisms and said enclosure base are composed of a substantially same material.

7. The hermetically-sealed container of claim 1, wherein said plurality of spacing mechanisms comprises a protrusion from each of said inner surface, said bottom surface, and said outer surface of at least one said sidewall.

8. The hermetically-sealed container of claim 1, wherein said plurality of spacing mechanisms comprises a protrusion inward from each of said inner surface and said outer surface of at least one said groove.

9. The hermetically-sealed container of claim 1, wherein said plurality of spacing mechanisms comprises:
   a protrusion from each of said bottom surface and said outer surface of at least one said sidewall; and
   a protrusion outward from said inner surface of at least one said groove.

10. The hermetically-sealed container of claim 1, wherein said plurality of spacing mechanisms comprises:
    a protrusion from each of said bottom surface and said inner surface of at least one of said plurality of sidewalls; and
    a protrusion inward from said outer surface of at least one said groove.

11. The hermetically-sealed container of claim 1, further comprising and contained therein:
    a plurality of spinning-disk data storage devices; and
    a lighter-than-air gas.

12. The hermetically-sealed container of claim 11, wherein said lighter-than-air gas comprises helium.

13. The hermetically-sealed container of claim 1, further comprising and contained therein:
    a recording disk medium rotatably mounted on a spindle;
    a head slider comprising a read-write transducer configured to write to and to read from said disk medium;
    a rotary actuator assembly configured to move said head slider to access portions of said disk medium; and
    a lighter-than-air gas.

14. The hermetically-sealed container of claim 13, wherein said lighter-than-air gas comprises helium.

15. A method of hermetically sealing a container housing one or more data storage devices, the method comprising:
    inserting each of a plurality of container sidewalls into a corresponding groove of a plurality of grooves in a container base with a plurality of gap spacing mechanisms disposed therebetween;
    dispensing an adhesive into each said groove such that said gap spacing mechanisms maintain a gap between each said container sidewall and said corresponding groove in said container base to enable substantial capillary action flow so that said adhesive wets each of a corresponding inner surface, bottom surface, and outer surface of each said container sidewall and of said corresponding groove of said base; and
    curing said adhesive to form a hermetic bond between each said container sidewall and said corresponding groove in said container base.

16. The method of claim 15, wherein said adhesive is an epoxy-based liquid adhesive prior to curing.

17. The method of claim 15, wherein each said gap spacing mechanism comprises a plurality of thin wires and/or metal foil strips positioned intermittently along said corresponding grooves.

18. The method of claim 15, wherein said gap spacing mechanisms and said container base are composed of a substantially same material.

19. The method of claim 15, wherein at least one said gap spacing mechanism comprises a protrusion from each of said inner surface, said bottom surface, and said outer surface of at least one said container sidewall.

20. The method of claim 15, wherein at least one said gap spacing mechanism comprises a protrusion inward from each of said inner surface and said outer surface of at least one said corresponding groove.

21. The method of claim 15, wherein at least one said gap spacing mechanism comprises:
    a protrusion from each of said bottom surface and said outer surface of at least one said sidewall; and
    a protrusion inward from said inner surface of said corresponding groove.

22. The method of claim 15, wherein at least one said gap spacing mechanism comprises:
    a protrusion from each of said bottom surface and said inner surface of at least one said sidewall; and
    a protrusion inward from said outer surface of said corresponding groove.

23. The method of claim 15, further comprising:
    filling said container with a lighter-than-air gas.

24. A method of enabling a liquid adhesive dispensed into a plurality of grooves in a container base housing one or more data storage devices to wet (1) each of an inner surface, a bottom surface, and an outer surface of each of a plurality of container sidewalls positioned within a corresponding groove of said plurality of grooves and (2) each of a corresponding inner surface, bottom surface, and outer surface of said corresponding groove, the method comprising:
    providing means for ensuring a gap space between each said inner surface, bottom surface, and outer surface of each said container sidewall and each said corresponding inner surface, bottom surface, and outer surface of said corresponding groove to facilitate capillary action of said liquid adhesive groove; and
    dispensing said adhesive within each said corresponding groove to bond each said container sidewall with said container base.

* * * * *